(12) United States Patent
Cho et al.

(10) Patent No.: US 8,564,107 B2
(45) Date of Patent: Oct. 22, 2013

(54) LEAD FRAME AND METHOD FOR MANUFACTURING THE SAME

(75) Inventors: In Kuk Cho, Seoul (KR); Kyoung Taek Park, Seoul (KR); Sang Soo Kwak, Seoul (KR); Eun Jin Kim, Seoul (KR); Jin Young Son, Seoul (KR); Chang Hwa Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/256,091

(22) PCT Filed: Feb. 23, 2010

(86) PCT No.: PCT/KR2010/001098
§ 371 (c)(1),
(2), (4) Date: Sep. 12, 2011

(87) PCT Pub. No.: WO2010/104274
PCT Pub. Date: Sep. 16, 2010

(65) Prior Publication Data
US 2012/0001307 A1    Jan. 5, 2012

(30) Foreign Application Priority Data

Mar. 12, 2009 (KR) .................. 10-2009-0021371

(51) Int. Cl.
*H01L 23/495* (2006.01)
*H01L 21/00* (2006.01)

(52) U.S. Cl.
USPC ........... 257/666; 257/667; 257/677; 438/106; 438/111

(58) Field of Classification Search
USPC .......... 257/666–667, 677; 438/106, 111, 121, 438/123
See application file for complete search history.

(56) References Cited

U.S. PATENT DOCUMENTS

| | | | | |
|---|---|---|---|---|
| 6,037,653 A | * | 3/2000 | Kim et al. | 257/666 |
| 6,150,713 A | * | 11/2000 | Park et al. | 257/677 |
| 6,376,921 B1 | * | 4/2002 | Yoneda et al. | 257/787 |
| 6,593,643 B1 | * | 7/2003 | Seki et al. | 257/677 |
| 6,864,423 B2 | * | 3/2005 | Tan et al. | 174/536 |
| 7,462,926 B2 | * | 12/2008 | Fu et al. | 257/677 |

(Continued)

FOREIGN PATENT DOCUMENTS

| | | |
|---|---|---|
| JP | 06-001798 A | 1/1994 |
| JP | 09-148508 A | 6/1997 |

(Continued)

OTHER PUBLICATIONS

International Search Report in International Application No. PCT/KR2010/001098, filed Feb. 23, 2010.

(Continued)

*Primary Examiner* — Long K Tran
*Assistant Examiner* — Dzung Tran
(74) *Attorney, Agent, or Firm* — Saliwanchik, Lloyd & Eisenschenk

(57) ABSTRACT

A lead frame comprises: a base metal layer; a copper plating layer, including one of a copper layer and an alloy layer including a copper, configured to plate the based metal layer to make a surface roughness; and an upper plating layer, including at least one plating layer including at least one selected from the group of a nickel, a palladium, a gold, a silver, a nickel alloy, a palladium alloy, a gold alloy, and a silver alloy, configured to plate the copper plating layer.

18 Claims, 1 Drawing Sheet

(56) References Cited

U.S. PATENT DOCUMENTS

| | | | |
|---|---|---|---|
| 2002/0153596 A1* | 10/2002 | Tsubosaki et al. | 257/666 |
| 2004/0232534 A1* | 11/2004 | Seki et al. | 257/678 |
| 2009/0146280 A1* | 6/2009 | Shimazaki et al. | 257/676 |
| 2009/0283884 A1* | 11/2009 | Kang et al. | 257/676 |

FOREIGN PATENT DOCUMENTS

| | | |
|---|---|---|
| JP | 09-307050 A | 11/1997 |
| JP | 2001-127229 A | 5/2001 |
| JP | 2002-280488 A | 9/2002 |
| JP | 2005-213573 A | 8/2005 |
| JP | 2007-258205 A | 10/2007 |
| KR | 10-2007-0119758 A | 12/2007 |

OTHER PUBLICATIONS

Office Action dated Mar. 5, 2013 in Japanese Application No. 2011-553935, filed Feb. 23, 2010.

Office Action dated Jan. 25, 2013 in Taiwanese Application No. 099104965, filed Feb. 22, 2010.

Office Action dated Sep. 15, 2011 in Korean Application No. 10-2009-0021371, filed Mar. 12, 2009.

Office Action dated May 18, 2012 in Korean Application No. 10-2009-0021371, filed Mar. 12, 2009.

\* cited by examiner

LEAD FRAME AND METHOD FOR MANUFACTURING THE SAME

CROSS-REFERENCE TO RELATED APPLICATIONS

This application is the U.S. national stage application of International Patent Application No. PCT/KR2010/001098, filed Feb. 23, 2010, which claims priority to Korean Application No. 10-2009-0021371, filed Mar. 12, 2009, the disclosures of each of which are incorporated herein by reference in their entirety.

TECHNICAL FIELD

The present invention relates to a lead frame for a semiconductor package and a method for manufacturing the lead frame, and more particularly, to a lead frame for a semiconductor package which can maintain or raise a quality of the semiconductor package at a low cost of production.

BACKGROUND ART

A lead frame like a semiconductor chip is one of components included in a semiconductor package. The lead frame serves as both a wire for connecting the semiconductor chip to an external circuit and a supporting form for mounting the semiconductor chip and fixing the same at a static state.

A conventional lead frame is manufactured by a pre-plating method. According to the pre-plating method, a lead frame is pre-plated with plural metal layers which have an excellent wettability at soldering processes so that lead plating process is not required to outer lead frame of the semiconductor package at post treatment. Herein, wettability related to mold compound adhesion and moisture performance is measure of how well the solder joins the device lead or terminal to a board. Thus, it is possible to manufacture a no-lead or leadless semiconductor package.

The pre-plating method without the lead plating process may reduce some fabrication steps at the post treatment as well as have an advantage to prevent environmental contamination.

However, since a lead frame is plated with high-priced metals, cost of production for semiconductor package manufactured by the pre-plating method increases.

DISCLOSURE OF INVENTION

Technical Problem

An embodiment of the present invention is to provide a lead frame and a method for manufacturing the lead frame, and provide a method for decrease a thickness of high-priced metal used in a pre-plating method for manufacturing a lead frame.

Also, an embodiment of the present invention is to provide a method for improving or enhancing performance of the semiconductor package including a lead frame at a low cost of production.

Further, an embodiment of the present invention is to provide a lead frame advanced in wire-bonding strength, solerability, mold compound adhesion, and lamination quality.

Solution to Problem

In an embodiment of the present invention, a lead frame comprises: a base metal layer; a copper plating layer, including at least one of a copper layer and an alloy layer including a copper, configured to plate the based metal layer to make a surface roughness; and an upper plating layer, including at least one plating layer including at least one selected from the group of a nickel, a palladium, a gold, a silver, a nickel alloy, a palladium alloy, a gold alloy, and a silver alloy, configured to plate the copper plating layer.

In another embodiment of the present invention, a method for manufacturing a lead frame comprises: providing a base metal layer; forming a copper plating layer, including one of a copper layer and an alloy layer including a copper, plating the based metal layer to make a surface roughness; and forming an upper plating layer, including at least one layer constituted with at least one selected from the group of a nickel, a palladium, a gold, a silver, a nickel alloy, a palladium alloy, a gold alloy, and a silver alloy, configured to plate the copper plating layer.

Advantageous Effects of Invention

The present invention provides a lead frame and a method for manufacturing the lead frame, and provide a method for decrease a thickness of high-priced metal used in a pre-plating method for manufacturing a lead frame.

Also, the present invention provides a method for improving or enhancing performance of the semiconductor package including a lead frame at a low cost of production.

Further, the present invention provides a lead frame advanced in wire-bonding strength, solerability, mold compound adhesion, and lamination quality.

BEST MODE FOR CARRYING OUT THE INVENTION

The invention shows a lead frame and a manufacturing method of the lead frame. Although manufactured at low cost of production, the lead frame according to an embodiment of the invention includes advanced electronic or mechanical properties. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

Hereinafter reference will now be made in detail to various embodiments of the present invention, examples of which are illustrated in the accompanying drawings and described below.

Figure 1:
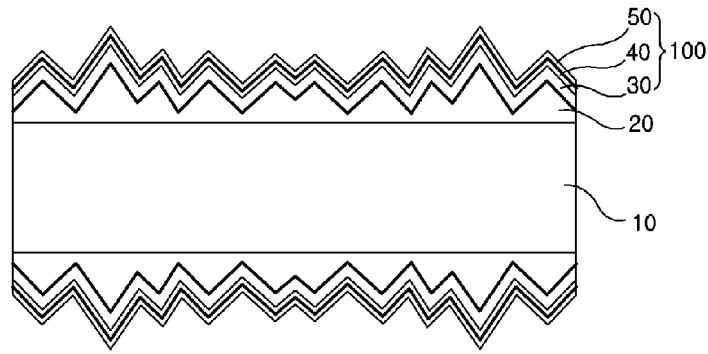
FIG. 1 is a cross-sectional view describing a lead frame according to an embodiment of the present invention.

FIG. 1 is a cross-sectional view describing a lead frame according to an embodiment of the present invention.

Referring to FIG. 1, the lead frame comprises a base metal layer 10, a copper plating layer 20 formed on a surface of the base metal layer 10, and an upper plating layer 100 deposited on a surface of the copper plating layer 20. The upper plating layer 100 includes at least one layer constituted with at least one selected from the group of a nickel (Ni), a palladium (Pd), a gold (Au), a silver (Ag), a nickel alloy, a palladium alloy, a gold alloy, and a silver alloy, to plate the copper plating layer 20.

The upper plating layer 100 comprises a nickel plating layer 30, a palladium plating layer 40 formed on a surface of the nickel plating layer 30 so that the nickel plating layer 30 is plated with the palladium plating layer 40, and a gold plating layer 50 formed on the palladium plating layer 40.

In addition, on the gold plating layer 50, a silver plating layer not shown in FIG. 1 can be formed. Further, the upper plating layer 100 comprises either a single thin layer constituted with one selected from the group of a nickel (Ni), a palladium (Pd), a gold (Au), a silver (Ag), a nickel alloy, a palladium alloy, a gold alloy, and a silver alloy or a plural thin layer constituted with plural materials selected from the same group.

The base metal layer 10 is served as a body of the lead frame. According to an embodiment, the based metal layer 10 comprises one of a copper layer and an alloy layer including a copper (Cu).

The copper plating layer 20 comprising one of a copper layer and an alloy layer of a copper (Cu) is formed by a copper sulfate plating process for roughening a surface of the copper plating layer 20. The copper sulfate plating process uses a copper sulfate ($CuSO_4$) which works with a metal such as an iron, a steel, a brass, and etc. The copper plating layer 20 formed in a thickness of 0.3 to 1.5 μm has a surface roughness of 150 to 400 nm. As a result, a surface roughness of the copper plating layer 20 is increased.

Figure 2:
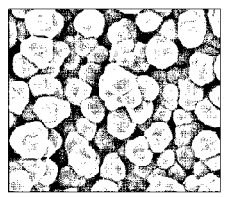
FIG. 2 is a photograph showing a copper plating layer described in FIG. 1.

FIG. 2 is a photograph showing a copper plating layer described in FIG. 1. As shown in FIG. 2, a crystalline size at a surface of the copper plating layer 20 formed by the copper sulfate plating process increases to provide a rough surface.

The nickel plating layer 30 including a thin film of the nickel (Ni) or the nickel alloy is formed in a thickness of 0.2 to 1 μm.

The palladium plating layer 40 including a thin film of the palladium (Pd) or the palladium alloy is formed in a thickness of 0.02 to 0.08 μm.

The gold plating layer 50 including a thin film of the gold (Au) or the gold alloy is formed in a thickness of 0.003 to 0.01 μm.

Referring to FIG. 1, since the copper plating layer 20 has a surface roughness of 150 to 400 nm, the nickel plating layer 30, the palladium plating layer 40, and the gold plating layer 50 also provide a rough surface.

As described above, the lead frame according to an embodiment of the invention can improve or enhance wire-bonding strength, solerability, mold compound adhesion, and lamination quality because of the copper plating layer 20 formed on the base metal layer 10 having a big crystalline size and a rough surface.

Further, in an embodiment of the invention, the lead frame comprises the copper plating layer 20 so that thicknesses of the nickel plating layer 30, the palladium plating layer 40, and the gold plating layer 50 can be reduced. As a result, a cost of production for the lead frame decreases.

FIG. 1 shows the lead frame including the nickel plating layer 30, the palladium plating layer 40, and the gold plating layer 50 formed at both sides of the base metal layer 10. However, in another embodiment of the invention, the lead frame comprises the nickel plating layer 30, the palladium plating layer 40, and the gold plating layer 50 formed only one side of the base metal layer 10.

Figure 3:
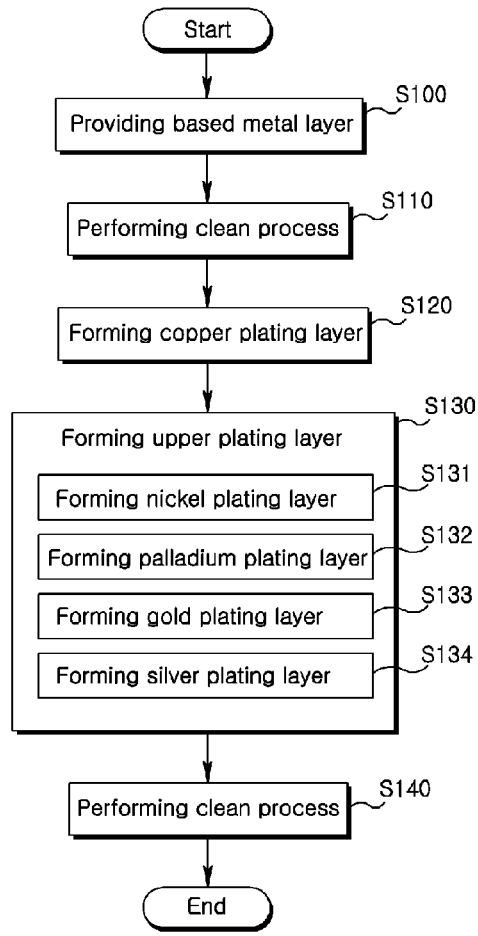
FIG. 3 is a flowchart depicting a method of manufacturing a lead frame according to an embodiment of the present invention.

FIG. 3 is a flowchart depicting a method of manufacturing a lead frame according to an embodiment of the present invention.

In the embodiment of the present invention, the lead frame can be manufactured by a reel-to-reel process or a strip process per an individual product unit as well as an inline process.

Referring to FIG. 3, the based metal layer 10 is provided. (S100) For example, the based metal layer 10 comprises one of a copper layer and an alloy layer including a copper (Cu). In the embodiment shown in FIG. 1, the based metal layer 10 includes a copper layer.

A clean process to the copper layer of the based metal layer 10 is performed. (S110) According to an embodiment, the clean process further includes one or more processes of a degreasing process, an electrolytic cleaning, and a pickling process.

The copper plating layer 20 is formed on the based metal layer 10 by a copper sulfate plating process. (S120) The copper sulfate plating process is a kind of electroplating method performed under a copper sulfate solution ($CuSO_4 5H_2O$). For example, the copper sulfate plating process is performed for about 10 to 40 sec. under a copper ion concentration of about 5 to 70 g/L and a current density of about 3 to 7 ASD so that the copper plating layer 20 formed in a thickness of about 0.3 to 1.5 μm can have a surface roughness of about 150 to 400 nm.

Herein, the copper sulfate solution ($CuSO_4 5H_2O$) can provide a plating layer having a bigger surface roughness than other plating solution such as a copper cyanide (CuCN). Particularly, in the embodiment of the invention, a plating process performed under a high current density with the copper sulfate solution ($CuSO_4 5H_2O$) can form the copper plating layer 20 in a thickness of 0.3 to 1.5 μm.

Then, the upper plating layer 100 is formed on the copper plating layer 20. (S130)

In detail, the copper plating layer 20 is plated with a nickel (Ni) to form the nickel plating layer 30 on a surface of the copper plating layer 20. (S131)

Additionally, the nickel plating layer 30 is plated with a palladium (Pd) to form the palladium plating layer 40. (S132)

Also, the palladium plating layer 40 is plated with a gold (Au) to form the gold plating layer 50. (S133)

After the gold plating layer 50 is formed, a silver plating layer is formed. (S134)

Subsequently, a clean process can be performed. (S140)

As described above, the nickel plating layer 30, the palladium plating layer 40, the gold plating layer 50, and the silver plating layer are sequentially formed to form the upper plating layer 100. However, according to an embodiment, the upper plating layer 100 can be constituted with some layers among the nickel plating layer 30, the palladium plating layer 40, the gold plating layer 50, and the silver plating layer or plural layers where some layers among them are repeatedly deposited in shift. Further, according to an embodiment, a formation sequence of them can be changed.

Also, the upper plating layer 100 is formed by plating with not-alloyed metal in above embodiment; however, it is possible to form the upper plating layer 100 by plating with alloyed metal such as a nickel alloy, a palladium alloy, a gold alloy, and a silver alloy.

Meanwhile, the lead frame according to an embodiment has an adhesive strength varied based on a surface roughness of the copper plating layer 20.

In case that the copper plating layer 20 has a surface roughness of 150 to 200 nm, the lead frame has an adhesive strength of 4.5 to 6 kgf. If the copper plating layer 20 has a surface roughness of 200 to 300 nm, the lead frame has an adhesive strength of 6 to 7 kgf. In another case that the copper plating layer 20 has a surface roughness of 300 to 400 nm, the lead frame has an adhesive strength of 7 to 9 kgf.

It will be apparent to those skilled in the art that various modifications and variation can be made in the present invention without departing from the spirit or scope of the invention. Thus, it is intended that the present invention cover the modifications and variations of this invention, provided they come within the scope of the appended claims and their equivalents.

INDUSTRIAL APPLICABILITY

The present invention can be adapted to develop or maunfacture Read Frame.

The invention claimed is:

1. A lead frame, comprising:
    a base metal layer;
    a copper plating layer, including at least one of a copper layer and an alloy layer including a copper, configured to plate the base metal layer to make a surface roughness; and
    an upper plating layer,
    wherein the copper plating layer has a surface roughness ($R_a$) of 150 to 400 nm,
    wherein the upper plating layer comprises a nickel plating layer including at least one material selected from the group consisting of nickel and nickel alloy.

2. The lead frame according to claim 1, wherein the copper plating layer has a thickness of 0.3 to 1.5 μm.

3. The lead frame according to claim 1, wherein the upper plating layer is a palladium plating layer including the palladium or the palladium alloy.

4. The lead frame according to claim 1, wherein the upper plating layer is a gold plating layer ding the gold or the gold alloy.

5. The lead frame according to claim 1, wherein the upper plating layer comprises two plating layers including a nickel plating layer including the nickel or the nickel alloy; and
    a palladium plating layer, formed on the nickel plating layer, including the palladium or the palladium alloy.

6. The lead frame according to claim 1, wherein the upper plating layer comprises three plating layers including a nickel plating layer including the nickel or the nickel alloy;
    a palladium plating layer, formed on the nickel plating layer, including the palladium or the palladium alloy; and
    a gold plating layer, formed on the palladium plating layer, including the gold or the gold alloy.

7. The lead frame according to claim 1, wherein the base metal layer comprises at least one of a copper layer and an alloy layer including a copper.

8. The lead frame according to claim 1, wherein the nickel plating layer is formed in a thickness of 0.2 to 1 um.

9. The lead frame according to claim 3, wherein the palladium plating layer is formed in a thickness of 0.02 to 0.08 um.

10. The lead frame according to claim 4, wherein the gold plating layer is formed in a thickness of 0.003 to 0.01 um.

11. A method for manufacturing a lead frame, comprising:
    providing a base metal layer;
    forming a copper plating layer, including at least one of a copper layer and an alloy layer including a copper, plating the base metal layer to make a surface roughness; and
    forming an upper plating layer, including at least one layer constituted with at least one selected from the group of a nickel, a palladium, a gold, a silver, a nickel alloy, a palladium alloy, a gold alloy, and a silver alloy, configured to plate the copper plating layer,
    wherein forming the copper plating layer comprises performing a copper sulfate plating process for 10 to 40 seconds under a copper ion concentration of about 5 to 70 g/L and a current density of about 3 to 7 ASD, and
    wherein the copper plating layer is formed to have a surface roughness ($R_a$) of 150 to 400 nm.

12. The method according to claim 11, wherein the upper plating layer is a nickel plating layer including the nickel or the nickel alloy.

13. The method according to claim 11, wherein the upper plating layer is a palladium plating layer including the palladium or the palladium alloy.

14. The method according to claim 12, wherein the upper plating layer is a gold plating layer including the gold or the gold alloy.

15. The method according to claim 11, wherein the forming a copper plating layer comprises a copper sulfate plating process to plate the base metal layer with the copper.

16. The method according to claim 11, wherein the forming an upper plating layer comprises:
    forming a nickel plating layer including the nickel or the nickel alloy to plate the copper plating layer; and
    forming a palladium plating layer, formed on the nickel plating layer, including the palladium or the palladium alloy.

17. The method according to claim 11, wherein the copper plating layer has a thickness of 0.3 to 1.5 μm.

18. The method according to claim 11, wherein the forming an upper plating layer comprises:
    forming a nickel plating layer including a thin film of the nickel or the nickel alloy to plate the copper plating layer, wherein the thin film of the nickel or the nickel alloy has a thickness in a range of from 0.2 to 1 μm;
    forming a palladium plating layer, formed on the nickel plating layer, including the palladium or the palladium alloy; and
    forming a gold plating layer, formed on the palladium plating layer, including the gold or the gold alloy.

* * * * *